United States Patent
Bao et al.

(10) Patent No.: US 9,606,987 B2
(45) Date of Patent: Mar. 28, 2017

(54) METHODS AND SYSTEMS FOR GENERATION OF A TRANSLATABLE SENTENCE SYNTAX IN A SOCIAL NETWORKING SYSTEM

(71) Applicant: Facebook, Inc., Menlo Park, CA (US)

(72) Inventors: Ling Bao, San Mateo, CA (US); Hugo Johan van Heuven, San Francisco, CA (US); Jiangbo Miao, San Jose, CA (US); Li Tan, Sunnyvale, CA (US); David Mercurio, San Francisco, CA (US); Maximilian Machedon, Palo Alto, CA (US)

(73) Assignee: Facebook, Inc., Menlo Park, CA (US)

( * ) Notice: Subject to any disclaimer, the term of this patent is extended or adjusted under 35 U.S.C. 154(b) by 102 days.

(21) Appl. No.: 13/888,244

(22) Filed: May 6, 2013

(65) Prior Publication Data

US 2014/0330551 A1 Nov. 6, 2014

(51) Int. Cl.
*G06F 17/27* (2006.01)
*G06F 17/28* (2006.01)
(Continued)

(52) U.S. Cl.
CPC .......... *G06F 17/2836* (2013.01); *G06F 17/30* (2013.01); *G06F 17/50* (2013.01)

(58) Field of Classification Search
CPC ...... G06F 17/271; G06F 17/289; G06F 17/28; G06F 9/4448
(Continued)

(56) References Cited

U.S. PATENT DOCUMENTS 6,025,836 A * 2/2000 McBride ................. 715/750
7,213,201 B2 5/2007 Brown et al.
(Continued)

FOREIGN PATENT DOCUMENTS

JP H08185404 A 7/1996

OTHER PUBLICATIONS

U.S. Appl. No. 13/868,917 by Bao et al., filed Apr. 23, 2013.
(Continued)

*Primary Examiner* — Akwasi M Sarpong
(74) *Attorney, Agent, or Firm* — Perkins Coie LLP

(57) ABSTRACT

Sentence internationalization methods and systems are disclosed. The method may include: providing a developer interface to define an internationalized sentence syntax for an application on a social networking system, the internationalized sentence syntax for translating a natural language expression of a social graph edge of the social networking system; providing a sentence option on the developer interface to define grammar of the internationalized sentence syntax; generating a token structure including a language token to assist translation of the internationalized sentence syntax into a preferred language indicated by the language token, the token structure customizable via the developer interface to configure translation options; associating a social graph attribute with a first token of the token structure; and storing the sentence option and the token structure with the internationalized sentence syntax to facilitate run-time translation of the internationalized sentence syntax into the natural language expression in the preferred language.

21 Claims, 6 Drawing Sheets

(51) Int. Cl.
*G06F 17/30* (2006.01)
*G06F 17/50* (2006.01)

(58) Field of Classification Search
USPC ........................................................ 704/3, 1
See application file for complete search history.

(56) References Cited

U.S. PATENT DOCUMENTS

| | | | |
|---|---|---|---|
| 7,302,383 B2 | 11/2007 | Valles | |
| 7,739,102 B2 | 6/2010 | Bender | |
| 7,747,427 B2 | 6/2010 | Lee et al. | |
| 7,788,591 B2 | 8/2010 | Brunner et al. | |
| 7,809,552 B2 | 10/2010 | Pan et al. | |
| 7,925,743 B2 | 4/2011 | Neely et al. | |
| 8,015,140 B2 | 9/2011 | Kumar et al. | |
| 8,082,151 B2 | 12/2011 | Bangalore et al. | |
| 8,280,888 B1 | 10/2012 | Bierner et al. | |
| 8,386,960 B1 | 2/2013 | Eismann et al. | |
| 8,417,513 B2 | 4/2013 | Prompt et al. | |
| 8,707,172 B2* | 4/2014 | Hagelund ........................ | 715/265 |
| 8,719,353 B2 | 5/2014 | Jore et al. | |
| 8,736,612 B1* | 5/2014 | Goldman et al. .............. | 345/440 |
| 8,862,622 B2 | 10/2014 | Shachar et al. | |
| 8,972,498 B2 | 3/2015 | Zheng | |
| 9,002,700 B2 | 4/2015 | Hoover et al. | |
| 9,110,889 B2 | 8/2015 | Bao et al. | |
| 9,213,760 B2 | 12/2015 | Betz et al. | |
| 2002/0107684 A1* | 8/2002 | Gao ................................ | 704/4 |
| 2004/0034520 A1* | 2/2004 | Langkilde-Geary | G06F 17/2881 704/1 |
| 2004/0177321 A1* | 9/2004 | Brown .................... | G06F 17/24 715/234 |
| 2005/0288920 A1* | 12/2005 | Green ................ | G06F 17/2785 704/3 |
| 2007/0150260 A1 | 6/2007 | Lee et al. | |
| 2009/0070103 A1 | 3/2009 | Beggelman et al. | |
| 2009/0076795 A1 | 3/2009 | Bangalore et al. | |
| 2009/0144392 A1 | 6/2009 | Wang et al. | |
| 2009/0177744 A1 | 7/2009 | Marlow et al. | |
| 2009/0193344 A1 | 7/2009 | Smyers et al. | |
| 2009/0198487 A1* | 8/2009 | Wong ...................... | G06F 17/28 704/4 |
| 2009/0222551 A1* | 9/2009 | Neely .................... | G06Q 30/02 709/224 |
| 2010/0100371 A1 | 4/2010 | Yuezhong et al. | |
| 2010/0191567 A1 | 7/2010 | Lee et al. | |
| 2010/0198581 A1* | 8/2010 | Ellis ................................ | 704/4 |
| 2010/0199184 A1 | 8/2010 | Horowitz et al. | |
| 2010/0318899 A1 | 12/2010 | Kitada | |
| 2010/0324985 A1 | 12/2010 | Kumar et al. | |
| 2011/0055336 A1 | 3/2011 | Park et al. | |
| 2011/0191316 A1 | 8/2011 | Lai et al. | |
| 2011/0208822 A1 | 8/2011 | Rathod et al. | |
| 2011/0276396 A1 | 11/2011 | Rathod | |
| 2011/0313757 A1 | 12/2011 | Hoover et al. | |
| 2012/0016661 A1 | 1/2012 | Pinkas et al. | |
| 2012/0296628 A1* | 11/2012 | Wren et al. ...................... | 704/2 |
| 2013/0073280 A1 | 3/2013 | O'Neil et al. | |
| 2013/0073979 A1 | 3/2013 | Shepherd et al. | |
| 2014/0046976 A1 | 2/2014 | Zhang et al. | |
| 2014/0074629 A1 | 3/2014 | Rathod et al. | |
| 2014/0108935 A1 | 4/2014 | Yuen et al. | |
| 2014/0149856 A1 | 5/2014 | Fong et al. | |
| 2014/0179424 A1 | 6/2014 | Perry et al. | |
| 2014/0278365 A1 | 9/2014 | Zhang et al. | |
| 2014/0316766 A1 | 10/2014 | Bao et al. | |
| 2015/0242385 A1 | 8/2015 | Bao et al. | |

OTHER PUBLICATIONS

U.S. Appl. No. 14/707,238 by Bao et al., filed May 8, 2015.
International Search Report and Written Opinion in International Application No. PCT/US2014/033052, mailing date Sep. 16, 2014, 12 pages.
Notice of Allowance Mailed Apr. 20, 2015 in U.S. Appl. No. 13/868,917 of Bao, L., et al., filed Apr. 23, 2013.
Supplemental Notice of Allowability Mailed May 15, 2015, in U.S. Appl. No. 13/868,917 of Bao, L., et al., filed Apr. 23, 2013.
Supplemental Notice of Allowability Mailed Jun. 1, 2015, in U.S. Appl. No. 13/868,917 of Bao, L., et al., filed Apr. 23, 2013.
Final Office Action Mailed Aug. 12, 2016 of U.S. Appl. No. 14/707,238 of Bao, L., et al., filed May 8, 2015.
Canada Office Action in Application No. 2,909,079, mailing date May 3, 2016, 5 pages.
Patent Examination Report No. 1 in Australian Application No. 2014257424, mailing date May 7, 2016, 2 pages.
Non-Final Office Action mailed Mar. 31, 2016, for U.S. Appl. No. 14/707,238 by Bao et al., filed May 8, 2015.
Advisory Action mailed Nov. 25, 2016, for U.S. Appl. No. 14/707,238 by Bao et al., filed May 8, 2015.
First Office Action in Chinese Application No. 2014800357163, mailing date Sep. 5, 2016, 14 pages.
Japanese Office Action in Application No. 2016510689, mailing date Sep. 27, 2016, 15 pages with English translation.
Office Action in Israel Application No. 242033, mailing date Oct. 5, 2016, 2 pages.
Notice of Allowance mailed Dec. 22, 2016, for U.S. Appl. No. 14/707,238 by Bao et al., filed May 8, 2015.

* cited by examiner

English Sentence.

John | likes | sports | and | 5 | other activities    410

John | vind | sporten | en | 5 | andere activiteiten | leuk    420

Translate the English sentence to Dutch using the tokens.

John | and | 5 | friends | stole bikes

John | 5 | ...

440
☑ Gender    English sentence to Dutch using the tokens.

John | read | Hamlet | and | 5 | Other books    430

O | John | Hamlet | 5 | ...

H | Jane | Hamlet | 5 | ...

METHODS AND SYSTEMS FOR GENERATION OF A TRANSLATABLE SENTENCE SYNTAX IN A SOCIAL NETWORKING SYSTEM

TECHNICAL FIELD

Various embodiments of the present disclosure generally relate to providing users with social networking experiences, and in particular to generate social expressions in a social networking system.

BACKGROUND

The majority of people around the globe are now connected online through social networking systems. A networking system may generate and maintain a social graph that comprises a plurality of nodes interconnected by a plurality of edges. Each node represents an object (e.g., place, movie, etc.) in the social networking system. The object may include a user object. Each of the plurality of edges represents a specific kind of connection between two nodes.

This structured data can be useful for rendering a meaningful experience for users of the networking system. Developers can publish new content to the social graph to extend structured data and link the objects with edges in the social graph. Users can query and generate graph searches within the structured data.

There are more than 6,000 living languages spoken in the world today. However, the dominant language of many popular social networking sites is still English. Not all languages have a single word to word or phrase to phrase translation that maps with English or other languages. When third party developers create applications that publish new content to the social graph, machine generated translations of these applications' expressions used to render the structured social graph data in feed stories, search results, and other types of experiences may lead to awkward or inaccurately translated sentences and experiences.

SUMMARY

Embodiments of the present disclosure provide a variety of methods and systems for customizing translations of sentences for representing relationships or actions performed by actors through an application running on a social networking system. The sentences are published by applications to the social graph. These sentences can appear in news feed stories, search results, profile stories, or in other experiences that occur on or off a social network system. In one embodiment, actors may be represented as objects in a social network system and actions or relationships may be represented as edges. Typically, a default sentence structure includes an actor, the edge, the target that the actor interacted with, and the application that published the sentence on the social network system on behalf of the actor. For example, the following story may be published to the social network system: "Nair finished reading The Name of the Wind on MyReader." In this example, the actor is "Nair," the edge is "finished reading," the target is "The Name of the Wind" (a book), and the application is "MyReader."

In certain circumstances, a translation of the default sentence structure may not be accurately translated into another language without further information about the actor, edge, target, application, or any combination thereof. For example, a person may indicate in English that she greeted Sam, the published sentence in English thus may be "Naya greeted Sam." In this example, "Naya" is the actor, "greeted" is the edge; and "Sam" is the target. However, when this sentence is translated into other languages, information such as the age and/or gender of the actor may be necessary. For example, the verb form of "greeted" may be different depending on the gender of the actor. In other examples, translation into other languages may require information such as the relative ages between the actor and the target. Additional words may need to be added when the actor (e.g., "Naya") is younger than ("Sam").

An internationalization system, as described herein, includes a platform having a developer interface for customizing the syntax of a sentence for translation into another language when the sentence is published by the social networking system. The translatable sentence syntax is described herein as an internationalized sentence syntax. The developer interface enables developers to customize these internationalized sentence syntaxes for specific applications interfacing with the social graph. The developer interface may provide options for the developer to define an internationalized sentence syntax and translate expressions through the internationalized sentence syntax into one or more languages. The application developer can select, on the developer interface, one or more languages including a primary language associated with the specific application.

The application developer can define an "actor," "edge" and/or "target" of the internationalized sentence syntax as tokens by typing the tokens into corresponding text boxes. In some embodiments, the application can select a specific sentence from published information/detail page or posted comments by graying out the corresponding texts. The internationalization system may analyze the grammar of the selected sentence to extract "actor," "edge" and/or "target" of the specific sentence.

In some embodiments, the developer interface provides a language token for the developer to specify the languages to publish the internationalized sentence syntax. The language token may include a check-box list, a "select language" drop-down menu, a selection list, a list of buttons, multiple layered menu levels, or any combination thereof. Languages in the language token can be presented in the alphabetical order of the languages' first letters. In some embodiments, the languages are presented in hierarchy of their relevancy to the application developer or the application itself.

In some embodiments, a "gender" token is provided for the developer to define the gender of an "actor" of the internationalized sentence syntax. The internationalized sentence syntax can be translated based on an actor's specific gender.

In some embodiments, a "target" token is provided for the developer to determine whether a "target" of the sentence is possessive or nominative. In some languages, the actual name of a person possessing a target may change depending on whether the target is possessive or nominative.

Depending on the user-selected languages, a "viewer" token may be provided for the developer to select the gender and/or seniority of the targeted viewers. The translations of the internationalized sentence syntax may be tailored to the targeted viewers.

In some embodiments, a number token is provided for each number that is recited in the internationalized sentence syntax. The number token enables the developer to select a plural type of the number. Numbers may have different plural types in some languages. In some embodiments, the developer interface can automatically detect the plural type of numbers in the internationalized sentence syntax based on the languages selected by the developer.

In some embodiments, the social networking system stores published sentences and their corresponding translations in other languages in a cache storage. When the internationalized sentence syntax is defined by the developer, the social networking system can search the cache storage for translations of the internationalized sentence syntax and its variations. The search results can then be presented on the social networking system based on their relevance to a viewer user, the application, or to the developer.

In some embodiments, translations stored in the social networking system can be dynamically expanded. A raw sentence that corresponds to the internationalized sentence syntax can be generated by the social networking system and provided to a third party for translations into other languages. Upon completion, the translations of the raw sentence can then be provided back to the social networking system. In some embodiments, translations from the third party are provided through a bulk hash that allows the third party to continue adding variations of the translations.

In some embodiments, the application may be configured to automatically detect a primary language of a viewer of the translated sentence based on browser setup, the viewer profile, activities of the viewer in the social networking system, etc.

While multiple embodiments are disclosed, still other embodiments of the present disclosure will become apparent to those skilled in the art from the following detailed description, which shows and describes illustrative embodiments of the invention. As will be realized, the invention is capable of modifications in various aspects, all without departing from the scope of the present disclosure. Accordingly, the drawings and detailed description are to be regarded as illustrative in nature and not restrictive.

BRIEF DESCRIPTION OF THE DRAWINGS

Embodiments of the present disclosure will be described and explained through the use of the accompanying drawings in which:

FIG. 4 illustrates examples of generating a sentence syntax by using a gender token on a developer interface;

Figure 1:
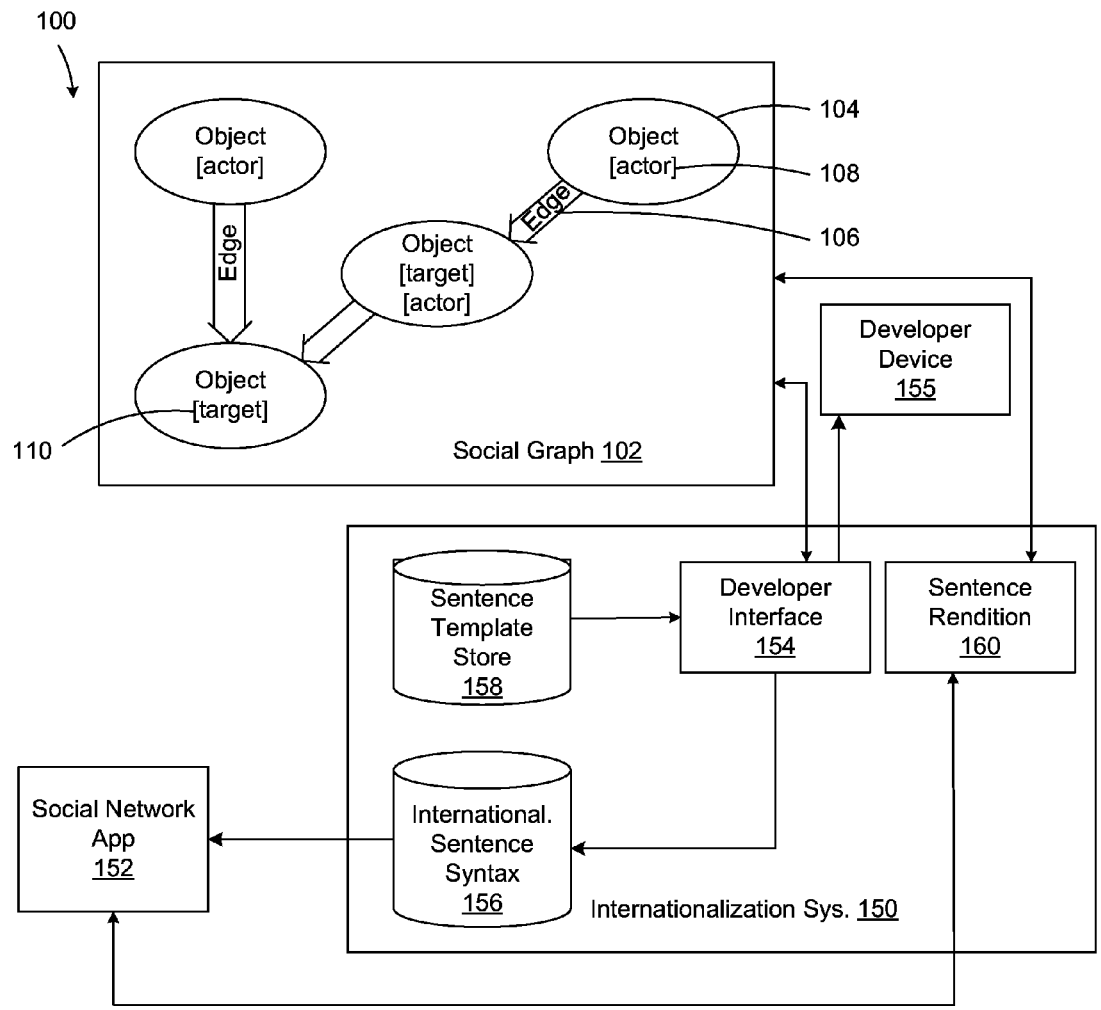
FIG. 1 illustrates a social networking system with a mechanism to generate internationalized sentence syntax.

The drawings have not necessarily been drawn to scale. For example, the dimensions of some of the elements in the figures may be expanded or reduced to help improve the understanding of the embodiments of the present disclosure. Similarly, some components and/or operations may be separated into different blocks or combined into a single block for the purposes of discussion of some of the embodiments of the present disclosure. Moreover, while the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

Various embodiments of the present disclosure generally relate to providing users with social networking experiences. More specifically, various embodiments of the present disclosure relate to systems and methods for providing a developer interface to define an internationalized sentence syntax for one or more languages and publishing a translated sentence using the internationalized sentence syntax through an application on a social networking system.

The developer interface may include various options including a plurality of tokens for the developer to define for the internationalized sentence syntax. Each token may correspond to a supported language of the one or more languages. The token allows for run-time selection of word variations based on attributes of an actor, an edge, a target, or a viewer of the internationalized sentence syntax. The plurality of tokens may include, but not limited to, a language token, a gender token, a target token, a number token, a viewer token, or any combination thereof.

While examples described herein refer to a networking system, the descriptions should not be taken as limiting the scope of the present disclosure. Various alternatives, modifications, and equivalents will be apparent to those skilled in the art without varying from the spirit of the invention. For example, generation of a translatable sentence syntax may be implemented on any user device in publishing an application and/or posting a comment, or any computing system for providing a service to users. For another example, the generation of these syntaxes may be implemented in any computing system having a web server system. The web server system may include a database management system (DBMS), such as HBase, MySQL, FoxPro, IBM DB2, Linter, Microsoft SQL Server, Oracle, PostgreSQL and SQLite etc.

FIG. 1 illustrates a social networking system 100 with a mechanism to generate an internationalized sentence syntax. The social networking system 100 provides mechanisms allowing users to interact with objects and other users both within and external to the context of the social networking system. The social networking system 100 includes a social graph 102. The social graph 102 includes multiple objects, such as an object 104, connected via edges, such as an edge 106. The object 104 of the social graph 102 may represent entities within the social networking system 100, such as users, pages, groups, businesses, other entities that a user may interact with, or any combination thereof. The edge 106 represents a relationship between the objects. The relationship may be directional. For example, the object responsible for creating the relationship may be considered as an actor 108. The object which is passive in receiving the relationship may be considered as a target 110. A single object, however, may be both considered as the actor 108 and the target 110 if there is an edge leading into the single object and an edge leading out of the single object. The social graph 102 is further described below.

One or more methods operating the social networking system 100 to generate internationalized sentence syntaxes may be implemented by modules and stores described below. The modules may be implemented as hardware components, software modules, or any combination thereof. For example, the modules described can be software modules implemented as instructions on a non-transitory memory capable of being executed by a processor or a controller on a machine.

Each of the modules may operate individually and independently of other modules. Some or all of the modules may be executed on the same host device or on separate devices. The separate devices can be coupled via a communication module to coordinate its operations. Some or all of the modules may be combined as one module. A single module may also be divided into sub-modules, each sub-module performing separate method step or method steps of the single module. The modules can share access to a memory space. One module may access data accessed by or transformed by another module. The modules may be considered "coupled" to one another if they share a physical connection or a virtual connection, directly or indirectly, allowing data accessed or modified from one module to be accessed in another module. The social networking system 100 may include additional, fewer, or different modules for various applications.

The storages or "stores", described below are hardware components or portions of hardware components for storing digital data, such as by running a network accessible database. Each of the storage can be a single physical entity or distributed through multiple physical devices. Each of the storage can be on separate physical device or share the same physical device or devices. Each of the stores can allocate specific storage spaces for run-time applications.

The social networking system 100 may include an internationalization system 150. The internationalization system 150 assists a developer of a social networking application 152 that may run on the social networking system 100. The social networking application 152 may also run as an external module on a separate server system as the social networking system 100. The social networking application 152 may then communicate with the social networking system 100 via a graph application programming interface (API) server of the social networking system 100 as described below. The social networking application 152 is a module that provides additional features for the users of the social networking system 100. Part of the social networking application 152 may be to interact with users by publishing sentences describing the evolution of the social graph 102 within the social networking system 100.

The internationalization system 150 includes a developer interface module 154 that generates and provides a developer interface for configuring internationalized sentence syntaxes on a developer device 155, such as a computer system or an electronic device with computer functionalities. For example, the developer interface enables a developer to generate an internationalized sentence syntax 156 that may be used to generate and publish translated sentences by the social networking application 152. For example, the developer interface enables the developer to insert tokens associated with actors, such as the actor 108, edges, such as the edge 106, targets, such as the target 110, additional constant or variable text templates, or any combination thereof into the internationalized sentence syntax 156. The configuration of the internationalized sentence syntax 156 may be stored as part of the social networking application 152, on the internationalization system 150, or both. The configuration of the internationalized sentence syntax 156 may be based on sentence template store 158 containing pre-configured internationalized sentence syntaxes.

The developer interface further enables associating any germane attributes to any token within the internationalized sentence syntax 156. For example, a particular language may require different phrasing of a natural language expression based on whether a token is a single item, a pair of items, or 3+ items. In this example, the developer interface enables the token to be tagged with a social graph attribute stating that the token can take on a value of 1, 2, or 3+. Through the developer interface, the developer can then specify how to phrase the internationalized sentence syntax 156 for each case (e.g., 1, 2, or 3+).

The internationalization system 150 further includes a sentence rendition module 160 that renders run-time instances of the internationalized sentence syntax 156. When the social networking application 152 is executed, the internationalized sentence syntax 156 is used to render expressions of the social graph on behalf of the social networking application 152, such as posting a news feed story or generating a mobile notification.

The internationalized sentence syntax 156 may be organized by edge configurations. Each internationalized sentence syntax 156 may be specific to an edge configuration. For example, the social networking application 152 can detect an actor based on a particular user logged on the social networking system 100 that subscribes to or runs the social networking application 152. The actor may be the particular user, friends of the particular user, or any other actors relevant to the particular user as decided by the social networking system 100. Edges that fit the edge configuration of internationalized sentence syntax 156 may be rendered into a rendered instance of an internationalized sentence syntax. In one embodiment, the sentence rendition module 160 is part of the social networking application 152.

The developer interface further enables the definition of multiple sentence configurations in the internationalized sentence syntax 156 for different circumstances. The multiple sentence configurations allow for different renditions of the internationalized sentence syntax 156 under different circumstances when rendered by the sentence rendition module 160. For example, the different circumstances include when the internationalized sentence syntax 156 is being rendered for a news feed, is being rendered for a personal timeline, or is being rendered as a search result. Aside from different forums, another scenario where multiple sentence configurations may be used is in the context of aggregations of user edges. For example, when a user has completed more than one hike in a week vs. when the user has hiked only once. The different circumstances can further include difference in timing of the edge configuration. For example, the circumstances include when the edge denotes a relationship that has happened in the past (e.g., Joe hiked Mt. Diablo trail), when the edge denotes a relationship that is happening (e.g., Joe started hiking Mt. Tam.), or when the edge denotes a relationship is happening in the future (e.g., Joe plans to travel to Italy in May).

The sentence rendition module 160 can receive a request to render an expression of the edge 106 of the social graph 102. The sentence rendition module 160 can then select a supported language of the internationalized sentence syntax 156 corresponding to a primary language of the viewer user. Then the sentence rendition module 160 renders a natural language expression in the supported language based on an attribute of the edge 106 or the objects 104 (e.g., the actor

108 or the target 110) connected to the edge 106. The rendering of the natural language expression includes matching the attribute to at least a token structure in the internationalized sentence syntax 156 defined for the attribute by the developer. The sentence rendition module 160 can then send the natural language expression for publishing in a forum of the social networking system.

Social Networking System Overview

An internationalization system 150 can be utilized in any data sharing system. Particularly, the internationalization system 150 can be utilized in the social networking system, such as a social networking system 100. Social networking systems commonly provide mechanisms allowing users to interact with objects and other users both within and external to the context of the social networking system. A social networking system user may be an individual or any other entity, such as a business or other non-person entity. The social networking system may utilize a web-based interface comprising a series of inter-connected pages displaying and allowing users to interact with social networking system objects and information. For example, a social networking system may display a page for each social networking system user comprising objects and information entered by or related to the social networking system user (e.g., the user's "profile"). Social networking systems may also contain pages containing pictures or videos, dedicated to concepts, dedicated to users with similar interests ("groups"), or containing communications or social networking system activity to, from or by other users. Social networking system pages may contain links to other social networking system pages, and may include additional capabilities such as search, real-time communication, content-item uploading, purchasing, advertising, and any other web-based technology or ability. It should be noted that a social networking system interface may be accessible from a web browser or a non-web browser application, such as a dedicated social networking system mobile device or computer application. "Page" as used herein may be a web page, an application interface or display, a widget displayed over a web page or application, a box or other graphical interface, an overlay window on another page (whether within or outside the context of a social networking system), or a web page external to the social networking system with a social networking system plug in or integration capabilities.

As discussed above, a social graph includes a set of nodes (representing social networking system objects, also known as social objects) interconnected by edges (representing interactions, activity, or relatedness). Each node in the social graph may represent something that can act on and/or be acted upon by another node. A social networking system object may be a social networking system user, nonperson entity, content item, group, social networking system page, location, application, subject, concept or other social networking system object, such as a movie, a band, or a book. Content items include anything that a social networking system user or other object may create, upload, edit, or interact with, such as messages, queued messages (e.g., email), text and SMS (short message service) messages, comment messages, messages sent using any other suitable messaging technique, an HTTP link, HTML files, images, videos, audio clips, documents, document edits, calendar entries or events, and other computer-related files. Subjects and concepts, in the context of a social graph, comprise nodes that represent any person, place, thing, or abstract idea. An edge between two nodes in the social graph represents a particular kind of connection between the two nodes, which may result from an action that was performed by one of the nodes on the other node or which otherwise describes a relationship between the nodes/objects.

A social networking system may allow a user to enter and display information related to the user's interests, education and work experience, contact information, and other biographical information in the user's profile page. Each school, employer, interest (for example, music, books, movies, television shows, games, political views, philosophy, religion, groups, or fan pages), geographical location, network, or any other information contained in a profile page may be represented by a node in the social graph. A social networking system may allow a user to upload or create pictures, videos, documents, songs, or other content items, and may allow a user to create and schedule events. Content items and events may be represented by nodes in the social graph.

A social networking system may provide a variety of means to interact with nonperson objects within the social networking system. For example, a user may form or join groups, or become a fan of a fan page within the social networking system. In addition, a user may create, download, view, upload, link to, tag, edit, or play a social networking system object. A user may interact with social networking system objects outside of the context of the social networking system. For example, an article on a news web site might have a "like" button that users can click. In each of these instances, the interaction between the user and the object may be represented by an edge in the social graph connecting the node of the user to the node of the object. A user may use location detection functionality (such as a GPS receiver on a mobile device) to "check in" to a particular location, and an edge may connect the user's node with the location's node in the social graph.

Social networking systems allow users to associate themselves and establish connections with other users of the social networking system. When two users explicitly establish a connection in the social networking system, they become "friends" (or, "connections") within the context of the social networking system. Being friends in a social networking system may allow users access to more information about each other than would otherwise be available to unconnected users. For instance, being friends may allow a user to view another user's profile, to see another user's friends, or to view pictures of another user. Likewise, becoming friends within a social networking system may allow a user greater access to communicate with another user, such as by email (internal and external to the social networking system), instant message, text message, phone, or any other communicative interface. Being friends may allow a user access to view, comment on, download, endorse or otherwise interact with another user's uploaded content items. Establishing connections, accessing user information, communicating, and interacting within the context of the social networking system may be represented by an edge between the nodes representing two social networking system users.

In addition to explicitly establishing a connection in the social networking system, users with common characteristics may be considered connected (such as a soft or implicit connection) for the purposes of determining social context for use in determining the topic of communications. In one embodiment, users who belong to a common network are considered connected. For example, users who attend a common school, work for a common company, or belong to a common social networking system group may be considered connected. In one embodiment, users with common biographical characteristics are considered connected. For example, the geographic region users were born in or live in, the age of users, the gender of users and the relationship status of users may be used to determine whether users are connected. In one embodiment, users with common interests are considered connected. For example, users' movie preferences, music preferences, political views, religious views, or any other interest may be used to determine whether users are connected. In one embodiment, users who have taken a common action within the social networking system are considered connected. For example, users who endorse or recommend a common object, who comment on a common content item, or who RSVP to a common event may be considered connected. A social networking system may utilize a social graph to determine users who are connected with a particular user in order to determine or evaluate the social context of the communications of the particular user, as will be described below in greater detail.

A social networking system may provide a variety of communication channels to users. For example, a social networking system may allow a user to email, instant message, or text/SMS message, one or more other users; may allow a user to post a message to the user's wall or profile or another user's wall or profile; may allow a user to post a message to a group or a fan page; or may allow a user to comment on an image, wall post or other content item created or uploaded by the user or another user. In one embodiment, a user posts a status message to the user's profile indicating a current event, state of mind, thought, feeling, activity, or any other present-time relevant communication. A social networking system may allow users to communicate both within and external to the social networking system. For example, a first user may send a second user a message within the social networking system, an email through the social networking system, an email external to but originating from the social networking system, an instant message within the social networking system, and an instant message external to but originating from the social networking system. Further, a first user may comment on the profile page of a second user, or may comment on objects associated with a second user, such as content items uploaded by the second user.

Social Networking System Environment and Architecture

Figure 2:
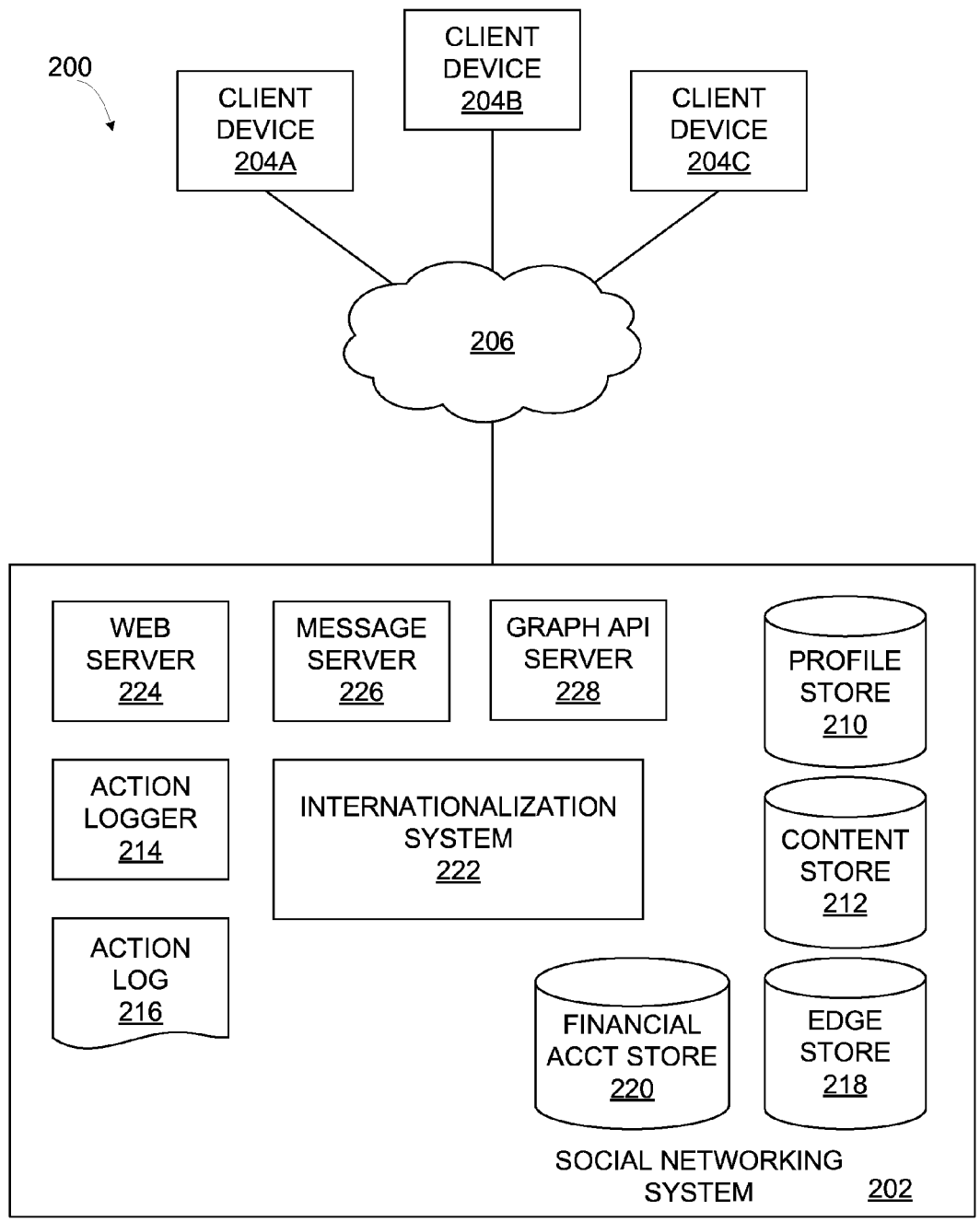
FIG. 2 is a high level block diagram of a system environment suitable for a social networking system, according to one embodiment.

Referring now to FIG. 2, therein is shown a high level block diagram of a system environment 200 suitable for a social networking system 202, according to one embodiment. The system environment 200 shown in FIG. 2 includes the social networking system 202, a client device 204A, and a network channel 206. The system environment 200 can include other client devices as well, such as a client device 204B and a client device 204C. For example, the client devices 204 may include the developer device 155 of FIG. 1. In other embodiments, the system environment 200 may include different and/or additional components than those shown by FIG. 2. The social networking system 202 can be the social networking system 100 of FIG. 1.

The social networking system 202, further described below, comprises one or more computing devices storing user profiles associated with users and/or other objects as well as connections between users and other users and/or objects. In use, users join the social networking system 202 and then add connections to other users or objects of the social networking system to which they desire to be connected. As further described below in conjunction with FIG. 2, users of the social networking system 202 may be individuals or entities such as businesses, organizations, universities, manufacturers. The social networking system 202 allows its users to interact with each other as well as with other objects maintained by the social networking system 202. In some embodiments, the social networking system 202 allows users to interact with third-party websites and a financial account provider.

Based on stored data about users, objects and connections between users and/or objects, the social networking system 202 generates and maintains a "social graph" comprising a plurality of nodes interconnected by a plurality of edges. Each node in the social graph represents an object or user that can act on another node and/or that can be acted on by another node. An edge between two nodes in the social graph represents a particular kind of connection between the two nodes, which may result from an action that was performed by one of the nodes on the other node. For example, when a user identifies an additional user as a friend, an edge in the social graph is generated connecting a node representing the first user and an additional node representing the additional user. The generated edge has a connection type indicating that the users are friends. As various nodes interact with each other, the social networking system 202 adds and/or modifies edges connecting the various nodes to reflect the interactions.

The client device 204A is a computing device capable of receiving user input as well as transmitting and/or receiving data via the network channel 206. In one embodiment, the client device 204A is a conventional computer system, such as a desktop or laptop computer. In another embodiment, the client device 204A may be a device having computer functionality, such as a personal digital assistant (PDA), mobile telephone, a tablet, a smart-phone or similar device. In yet another embodiment, the client device 204A can be a virtualized desktop running on a cloud computing service. The client device 204A is configured to communicate with the social networking system 202, and/or the financial account provider via the network channel 206. In one embodiment, the client device 204A executes an application allowing a user of the client device 204A to interact with the social networking system 202. For example, the client device 204A executes a browser application to enable interaction between the client device 204A and the social networking system 202 via the network channel 206. In another embodiment, a the client device 204A interacts with the social networking system 202 through an application programming interface (API) that runs on the native operating system of the client device 204A, such as IOS® or ANDROID™.

The client device 204A is configured to communicate via the network channel 206, which may comprise any combination of local area and/or wide area networks, using both wired and wireless communication systems. In one embodiment, the network channel 206 uses standard communications technologies and/or protocols. Thus, the network channel 206 may include links using technologies such as Ethernet, 802.11, worldwide interoperability for microwave access (WiMAX), 3G, 4G, CDMA, digital subscriber line (DSL), etc. Similarly, the networking protocols used on the network channel 206 may include multiprotocol label switching (MPLS), transmission control protocol/Internet protocol (TCP/IP), User Datagram Protocol (UDP), hypertext transport protocol (HTTP), simple mail transfer protocol (SMTP) and file transfer protocol (FTP). Data exchanged over the network channel 206 may be represented using technologies and/or formats including hypertext markup language (HTML) or extensible markup language (XML). In addition, all or some of links can be encrypted using conventional encryption technologies such as secure sockets layer (SSL), transport layer security (TLS), and Internet Protocol security (IPsec).

The social networking system 202 shown by FIG. 2 includes a profile store 210, a content store 212, an action logger 214, an action log 216, an edge store 218, a financial account store 220, an internationalization system 222, a web server 224, a message server 226, and an API request server 228. In other embodiments, the social networking system 202 may include additional, fewer, or different modules for various applications. Conventional components such as network interfaces, security mechanisms, load balancers, failover servers, management and network operations consoles, and the like are not shown so as to not obscure the details of the system architecture.

Each user of the social networking system 202 is associated with a user profile, which is stored in the profile store 210. A user profile includes declarative information about the user that was explicitly shared by the user, and may also include profile information inferred by the social networking system 202. In one embodiment, a user profile includes multiple data fields, each data field describing one or more attributes of the corresponding user of the social networking system 202. The user profile information stored in the profile store 210 describes the users of the social networking system 100, including biographic, demographic, and other types of descriptive information, such as work experience, educational history, gender, hobbies or preferences, location and the like. A user profile may also store other information provided by the user, for example, images or videos. In certain embodiments, images of users may be tagged with identification information of users of the social networking system 202 displayed in an image. A user profile in the profile store 210 may also maintain references to actions by the corresponding user performed on content items in the content store 212 and stored in the edge store 218.

As further described below, a user profile may be associated with one or more financial accounts, allowing the user profile to include data retrieved from or derived from a financial account. A user may specify one or more privacy settings, which are stored in the user profile, that limit information from a financial account that the social networking system 202 is permitted to access. For example, a privacy setting limits the social networking system 202 to accessing the transaction history of the financial account and not the current account balance. As another example, a privacy setting limits the social networking system 202 to a subset of the transaction history of the financial account, allowing the social networking system 202 to access transactions within a specified time range, transactions involving less than a threshold transaction amounts, transactions associated with specified vendor identifiers, transactions associated with vendor identifiers other than specified vendor identifiers or any suitable criteria limiting information from a financial account identified by a user that is accessible by the social networking system 202. In one embodiment, information from the financial account is stored in the profile store 210. In other embodiments, it may be stored in the financial account store 220.

The content store 212 stores content items associated with a user profile, such as images, videos or audio files. Content items from the content store 212 may be displayed when a user profile is viewed or when other content associated with the user profile is viewed. For example, displayed content items may show images or video associated with a user profile or show text describing a user's status. Additionally, other content items may facilitate user engagement by encouraging a user to expand his connections to other users, to invite new users to the system or to increase interaction with the social network system by displaying content related to users, objects, activities, or functionalities of the social networking system 202. Examples of social networking content items include suggested connections or suggestions to perform other actions, media provided to, or maintained by, the social networking system 202 (e.g., pictures or videos), status messages or links posted by users to the social networking system, events, groups, pages (e.g., representing an organization or commercial entity), and any other content provided by, or accessible via, the social networking system.

The content store 212 also includes one or more pages associated with entities having user profiles in the profile store 210. An entity is a non-individual user of the social networking system 202, such as a business, a vendor, an organization or a university. A page includes content associated with an entity and instructions for presenting the content to a social networking system user. For example, a page identifies content associated with the entity's user profile as well as information describing how to present the content to users viewing the brand page. Vendors may be associated with pages in the content store 212, allowing social networking system users to more easily interact with the vendor via the social networking system 202. A vendor identifier is associated with a vendor's page, allowing the social networking system 202 to identify the vendor and/or to retrieve additional information about the vendor from the profile store 210, the action log 216 or from any other suitable source using the vendor identifier. In some embodiments, the content store 212 may also store one or more targeting criteria associated with stored objects and identifying one or more characteristics of a user to which the object is eligible to be presented.

The action logger 214 receives communications about user actions on and/or off the social networking system 202, populating the action log 216 with information about user actions. Such actions may include, for example, adding a connection to another user, sending a message to another user, uploading an image, reading a message from another user, viewing content associated with another user, attending an event posted by another user, among others. In some embodiments, the action logger 214 receives, subject to one or more privacy settings, transaction information from a financial account associated with a user and identifies user actions from the transaction information. For example, the action logger 214 retrieves vendor identifiers from the financial account's transaction history and identifies an object, such as a page, in the social networking system associated with the vendor identifier. This allows the action logger 214 to identify a user's purchases of products or services that are associated with a page, or another object, in the content store 212. In addition, a number of actions described in connection with other objects are directed at particular users, so these actions are associated with those users as well. These actions are stored in the action log 216.

In accordance with various embodiments, the action logger 214 is capable of receiving communications from the web server 224 about user actions on and/or off the social networking system 200. The action logger 214 populates the action log 216 with information about user actions to track them. This information may be subject to privacy settings associated with the user. Any action that a particular user takes with respect to another user is associated with each user's profile, through information maintained in a database or other data repository, such as the action log 216. Such actions may include, for example, adding a connection to the other user, sending a message to the other user, reading a message from the other user, viewing content associated with the other user, attending an event posted by another user, being tagged in photos with another user, liking an entity, etc.

The action log 216 may be used by the social networking system 202 to track user actions on the social networking system 202, as well as external website that communicate information to the social networking system 202. Users may interact with various objects on the social networking system 202, including commenting on posts, sharing links, and checking-in to physical locations via a mobile device, accessing content items in a sequence or other interactions. Information describing these actions is stored in the action log 216. Additional examples of interactions with objects on the social networking system 202 included in the action log 216 include commenting on a photo album, communications between users, becoming a fan of a musician, adding an event to a calendar, joining a groups, becoming a fan of a brand page, creating an event, authorizing an application, using an application and engaging in a transaction. Additionally, the action log 216 records a user's interactions with advertisements on the social networking system 202 as well as applications operating on the social networking system 202. In some embodiments, data from the action log 216 is used to infer interests or preferences of the user, augmenting the interests included in the user profile and allowing a more complete understanding of user preferences.

Further, user actions that happened in particular context, such as when the user was shown or was seen accessing particular content on the social networking system 200, are captured along with the particular context and logged. For example, a particular user could be shown/not-shown information regarding candidate users every time the particular user accessed the social networking system 200 for a fixed period of time. Any actions taken by the user during this period of time are logged along with the context information (i.e., candidate users were provided/not provided to the particular user) and are recorded in the action log 216. In addition, a number of actions described below in connection with other objects are directed at particular users, so these actions are associated with those users as well.

The action log 216 may also store user actions taken on external websites and/or determined from a financial account associated with the user. For example, an e-commerce website that primarily sells sporting equipment at bargain prices may recognize a user of the social networking system 202 through social plug-ins that enable the e-commerce website to identify the user of the social networking system 202. Because users of the social networking system 202 are uniquely identifiable, e-commerce websites, such as this sporting equipment retailer, may use the information about these users as they visit their websites. The action log 216 records data about these users, including webpage viewing histories, advertisements that were engaged, purchases made, and other patterns from shopping and buying. Actions identified by the action logger 214 from the transaction history of a financial account associated with the user allow the action log 216 to record further information about additional types of user actions.

In one embodiment, the edge store 218 stores the information describing connections between users and other objects on the social networking system 202 in edge objects. The edge store 218 can store the social graph described above, such as the social graph 108 of FIG. 1. Some edges may be defined by users, allowing users to specify their relationships with other users. For example, users may generate edges with other users that parallel the users' real-life relationships, such as friends, co-workers, partners, and so forth. Other edges are generated when users interact with objects in the social networking system 202, such as expressing interest in a page on the social networking system, sharing a link with other users of the social networking system, and commenting on posts made by other users of the social networking system. The edge store 218 stores edge objects that include information about the edge, such as affinity scores for objects, interests, and other users. Affinity scores may be computed by the social networking system 202 over time to approximate a user's affinity for an object, interest, and other users in the social networking system 202 based on the actions performed by the user. Multiple interactions of the same type between a user and a specific target may be stored in one edge object in the edge store 218, in one embodiment. In some embodiments, connections between users may be stored in the profile store 210, or the profile store 210 may access the edge store 218 to determine connections between users. Users may select from predefined types of connections, or define their own connection types as needed.

The web server 224 links the social networking system 200 via a network to one or more client devices; the web server 224 serves web pages, as well as other web-related content, such as Java, Flash, XML, and so forth. The web server 224 may communicate with the message server 226 that provides the functionality of receiving and routing messages between the social networking system 200 and client devices. The messages processed by the message server 226 can be instant messages, queued messages (e.g., email), text and SMS (short message service) messages, or any other suitable messaging technique. In some embodiments, a message sent by a user to another can be viewed by other users of the social networking system 200, for example, by the connections of the user receiving the message. An example of a type of message that can be viewed by other users of the social networking system besides the recipient of the message is a wall post. In some embodiments, a user can send a private message to another user that can only be retrieved by the other user.

The API request server 228 allows external systems to access information from the social networking system 200 by calling APIs. The information provided by the social network may include user profile information or the connection information of users as determined by their individual privacy settings. For example, a system interested in predicting the probability of users forming a connection within a social networking system may send an API request to the social networking system 200 via a network. The API request is received at the social networking system 200 by the API request server 228. The API request server 228 processes the request by determining the appropriate response, which is then communicated back to the requesting system via a network.

The social networking system 202 also includes the internationalization system 222. The internationalization system 222 can be the internationalization system 150 of FIG. 1. The internationalization system 222 can access the stores and modules of the social networking system 202 in order to develop internationalized sentence syntaxes and generate translated sentences for an application running on the social networking system 202. As internationalized sentence syntaxes are developed, the internationalization system 222 can also work with other modules and stores of the social networking system 202 to display the translated sentences to the client device 204A based on configurations of the internationalized sentence syntax.

Figure 3:
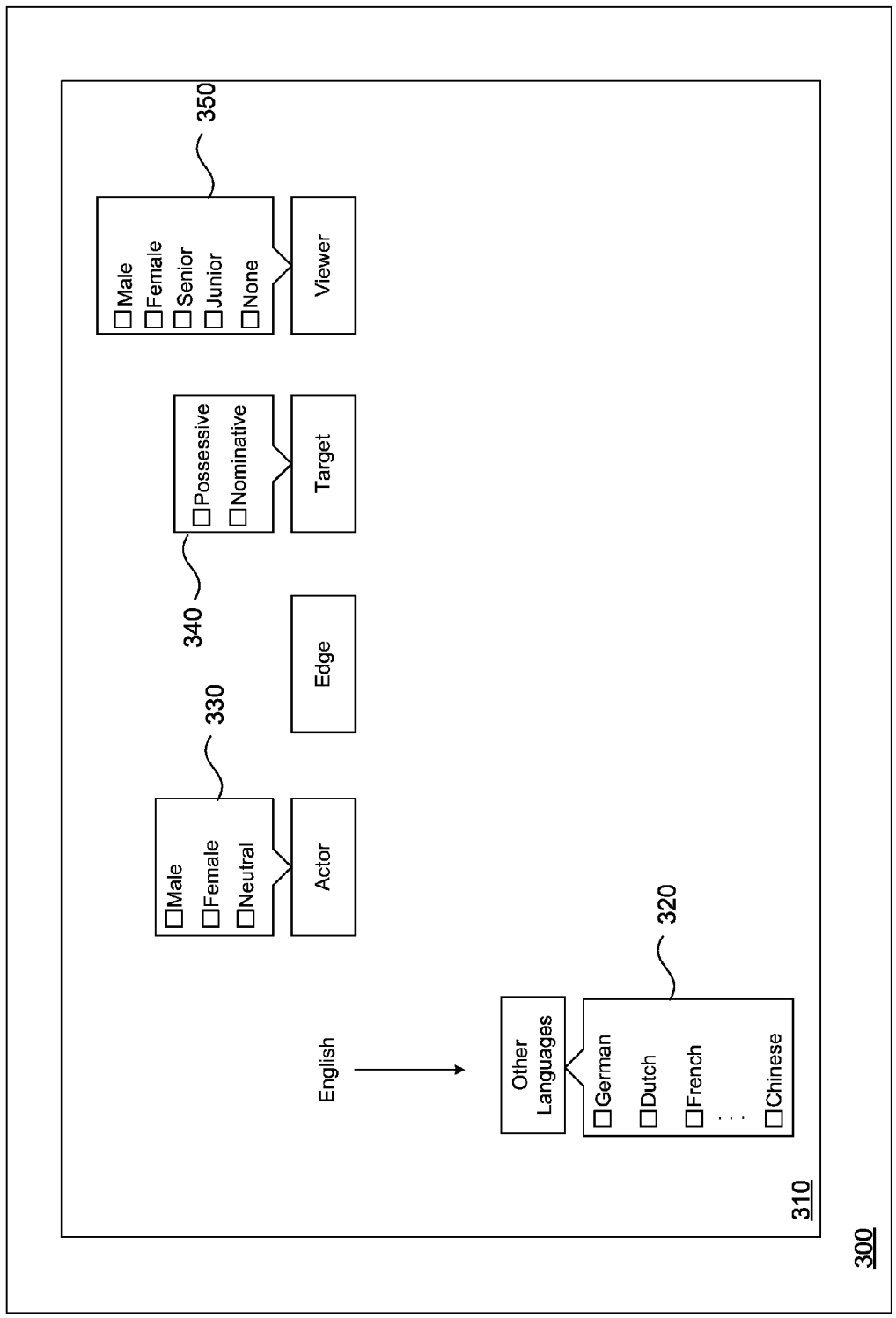
FIG. 3 illustrates a block diagram of using tokens to generate an internationalized sentence in a social networking system.

FIG. 3 illustrates a block diagram of using tokens to generate a specific internationalized sentence in a social networking system 300, such as the social networking system 100 of FIG. 1 or the social networking system 200 of FIG. 2. A set of internationalized sentence syntaxes may be configured on a developer interface and then rendered from social graph data of the social networking system.

The social networking system 300 includes a graph API server, such as the graph API server 228 to interact with a user device, such as the user device 204 of FIG. 2. The graph API server may facilitate recording of user profiles and activities in the social networking system 300. In some embodiments, the user profiles and activities can be stored in the profile store 210 and action log 216, respectively. The user profiles may include, but are not limited to, a particular user's name or user identifier (UID), profile picture, gender, birthday, networks, friend list, location, language, country, likes, favorite brands, news, outlets, restaurants, any information the particular user chooses to share with everyone, or any combination thereof.

An application developed by a developer may utilize a social graph stored on the social networking system 300 to interact with the social networking system 300. For example, the application may access the edge store 218 of FIG. 2 through the graph API server. FIG. 3 illustrates a specific developer interface in configuring the application to express information from the social graph through the application based on the internationalized sentence syntaxes.

The social networking system 300 may generate a developer interface 310, such as the developer interface generated by the developer interface module 154 of FIG. 1, instantiated on a device, such as the client device 204 of FIG. 2. The developer interface 310 allows the developer to configure the internationalized sentence syntax for an application, such as the internationalized sentence syntax 156 of FIG. 1 for the social networking application 152 of FIG. 1. The internationalized sentence syntax is used by the application to interpret actions performed by user accounts on the social networking system 300 and to express those actions in a meaningful way. The interpreted actions may be accessed from the action log 216 or from the edge store through the graph API server. The developer interface 310 can communicate directly with the social networking system 300 or indirectly through the graph API server.

The developer can select a primary language for an application on the developer interface 310 for expressions associated with the application. In some embodiments, the application may be configured to automatically detect a primary viewer language based on the viewer user's profile on the social networking system, the viewer user's browser setup, and/or the viewer user's activities in the social networking system 300.

The developer interface 310 provides multiple options for the developer to define an internationalized sentence syntax and select preferred languages. The internationalized sentence syntax may be translated into a language-specific syntax for each of the preferred languages. The preferred languages are languages supported by the internationalized sentence syntax. Ultimately, one or more of the internationalized sentence syntax or language-specific syntaxes are used to translate a sentence from one language into another language.

The developer can start by typing an internationalized sentence syntax or build the internationalized sentence syntax from published texts. To select the internationalized sentence syntax from published texts, the particular user can gray out the corresponding texts in the published information/detail page or posted comments.

The developer can define grammar (i.e., "actor," "action," and "target") of an internationalized sentence syntax by typing "actor," "action," and "target" into their corresponding text boxes. For example, the developer can define "actor" by typing "actor" of the internationalized sentence syntax into the "actor" text box. In some embodiments, the "actor" text box is pre-filled with the name of the particular user using the application associated with the internationalized sentence syntax created by the developer. In some examples of the application, either the application or the particular user can modify the "actor" to other names or add other friends as an actor.

Based on the developer's selection of edge, the developer interface 310 may provide a plurality of "verb tense" options for the developer to select. The developer can select a specific tense and preview the internationalized sentence syntax with the selected tense. The tense options may include, for example, past tense, plural past tense, present tense, plural present tense, continuous tense, perfect tense, perfect continuous tense and imperative tense. In the absence of the user's selection, the "action" can be displayed in the past tense by default.

When an edge is defined, the developer interface 310 may provide a plurality of sentences with connected targets for the developer to select. The plurality of sentences can be listed in the reverse order of their corresponding percentage of coverage. The percentage of coverage of a specific sentence is determined by impressions that the specific sentence has been viewed by users in the social networking system 300 over a given time frame. The sentence with the highest percentage of coverage is listed first or pops up in a window or in bold and large font as the most important.

If the specific sentence is selected from the published information/detail page or posted comments, the social networking system 300 may analyze the grammar of the specific sentence to generate a normalized representation of the text and pre-fill the "actor," "action" and/or "target" text boxes corresponding to the specific sentence. The developer can modify "actor," "action" and/or "target" of the internationalized sentence syntax by editing their corresponding text boxes.

The developer interface 310 may provide a language token 320 for the developer to select preferred languages to publish a sentence. The language token 320 may include, but not limited to, options such as: a check-box list, a "select language" drop-down menu, a selection list, a list of buttons, multiple layered menu levels, or any combination thereof. For example, the language token 320 may include a check-box for each preferred language selected by users in the social networking system 300. In some implementations, the language token 320 may include all native languages shared by two or more users in the social networking system 300, for example, German, Dutch, French, Chinese etc.

Languages in the language token 320 can be presented in the alphabetical order of languages' first letters. In some embodiments, the languages are presented in hierarchy of their relevance to the developer. For example, high relevant languages, such as language preferences currently or previously selected by the developer, and/or primary and preferred languages of friends (e.g., friends in the "actor" box and/or from the application user's friend list) etc., may be provided on top of a language checklist.

Based on the primary language and other language preferences selected by the developer, the developer interface 310 prompts one or more tokens for the developer to further define syntax translations of the internationalized sentence syntax. The tokens may include a gender token, a target token, a viewer token, a number token, or any combination thereof.

A gender token 330 can be provided for the developer to select gender of "actor" of the internationalized sentence syntax. The gender token 330 may include, but not limited to, options such as: a check-box, a radio button, a drop-down menu, a selection list, or any combination thereof. For example, the developer can define the actor as male, female, or neutral. The internationalized sentence syntax can be translated into the user's preferred languages based on the specific gender of "actor."

A target token 340 can be provided for the developer to determine if the target of the internationalized sentence syntax is possessive or nominative. The target token 340 may include, but not limited to, options such as: a check-box, a radio button, a drop-down menu, a selection list, or any combination thereof. In some languages, for example, Romanian language etc., the actual name of a person possessing a target may change depending on whether the target is possessive or nominative.

In some embodiments, a viewer token 350 is provided for the developer to determine gender and/or seniority of target viewers. The viewer token 350 may include, but not limited to, options such as: a check-box list, a radio button, a drop-down menu, a selection list, a list of buttons, multiple layered menu levels, or any combination thereof. The syntax translations of the internationalized sentence syntax may depend on the gender or seniority of the targeted viewers. For example, the internationalized sentence syntax can be translated differently for male viewers versus female viewers in some languages. For another example, syntax translations for senior viewers can be different from those for junior viewers in some languages.

In some embodiments, for each number in the internationalized sentence syntax, a number token is provided for the developer to select a plural type of the corresponding number. The plural can have many variations for numbers in some languages. For example, there are seven types of plurals for numbers in the Arabic language. In some embodiments, plural types of numbers in the internationalized sentence syntax can be automatically detected by the social networking system 300.

The social networking system 300 may store published sentences and their corresponding translations in its database. When an internationalized sentence syntax is defined by the developer, the social networking system 300 can search its database for syntax translations of the internationalized sentence syntax and variations of the internationalized sentence syntax. The search results are then presented to the developer based on their relevance to the internationalized sentence syntax. In some implementations, a search result with a higher percentage of impressions may be listed closer to the top of the search results. From the search results, the developer can select suitable syntax translations of the internationalized sentence syntax which are used to translate a sentence and publish the translated sentence.

In some embodiments, the social networking system 300 may automatically detect language setup on the client/user device using the application. For example, browsers on the particular client/user device may have a language setup with a particular language. If the particular language is different from that of the primary language of the internationalized sentence syntax, the social networking system 300 can search its databases for translations in the particular language and, if a match can be found, present the translations for the developer to review.

In some embodiments, a raw sentence corresponding to the internationalized sentence syntax in the social networking system 300 can be generated and provided to a third party for translations into users' preferred languages. The database of the social networking system 300 can be dynamically expanded by receiving the translations of the raw sentence and variations of the raw sentence from the third party. In some embodiments, the translations are received through a bulk hash, which allows the third party to continue adding variations of the translations.

FIG. 4 illustrates examples of generating syntax translations of an internationalized sentence syntax by using a gender token, in accordance with various embodiments of the present disclosure. In FIG. 4, the internationalized sentence syntax in a primary language (i.e., English) is "John likes sports and 5 other activities" 410. "John," "likes" and "sports and 5 other activities" correspond to actor, edge and target of the internationalized sentence syntax, respectively. The internationalized sentence syntax can be translated into a syntax in a preferred language such as Dutch, "John vind sport en 5 andere activiteiten" 420, by translating texts in each text box separately.

In some embodiments, the target "sports and 5 other activities" can be a variable. The social networking system 300 can search its database for translations to the internationalized sentence syntax and variations of the internationalized sentence syntax. The translations to variations of the internationalized sentence syntax can also be presented to the developer for review. For example, one variation of the internationalized sentence syntax, "John likes sports" is "John likes games," which can be translated to "John graag games" in Dutch. In operation, a translation of the internationalized sentence syntax (described herein as "syntax translation") is used to actually translate a sentence from one language (e.g., primary language) to another language (e.g., preferred language). In another embodiment, the variations of the internationalized sentence syntax may be used.

As illustrated in FIG. 4, a gender token is provided to translate an English sentence "John read Hamlet and 5 other books" 430. The words "John," "read" and "Hamlet" correspond to actor, edge and target of the English sentence, respectively. The developer can select the actor's gender 440 (i.e., male, female or neutral) with the "Gender" token. In response to the user's selection, the social network system 300 provides syntax translations with variations of actor's gender for the developer to select. For example, translations are provided for a "male" actor, "John," and a "female" actor, "Jane," respectively.

In some embodiments, space is provided in front of a number in a translated sentence. For example, the English word "other" actually may be placed in front of a number in some languages. The English sentence in the previous paragraph can be translated to "John leggere Amleto e altri 5 libri" in Italian. The Italian word "altri" (i.e., "other" in English) is placed in front of "5."

Figure 5:
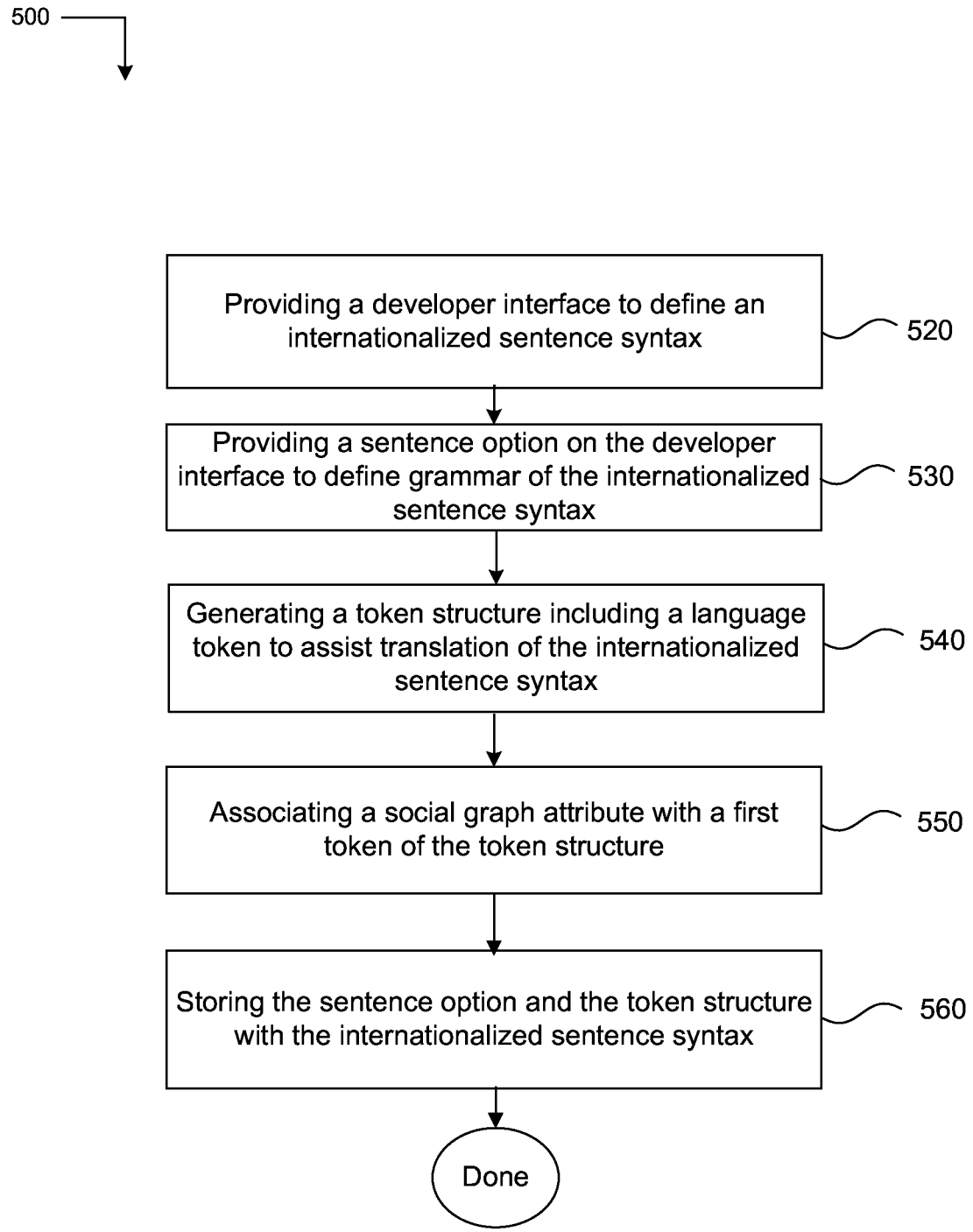
FIG. 5 illustrates a flow chart showing a set of operations that may be used for defining an internationalized sentence and translating the internationalized sentence into one or more languages, in accordance with various embodiments of the present disclosure.

FIG. 5 illustrates a flow chart showing a set of operations 500 that may be used for defining an internationalized sentence syntax and translating the internationalized sentence syntax into one or more language-specific syntaxes, in accordance with various embodiments of the present disclosure. The operations 500 may be performed by a social networking system, such as the social networking system 100 of FIG. 1 or the social networking system 202 of FIG. 2.

The social networking system provides a developer interface to define an internationalized sentence syntax for an application on a social networking system in step 520. The internationalized sentence syntax is used to translate a natural language expression of a social graph edge of the social networking system from one language into another.

The social networking system then provides a sentence option on the developer interface to define the grammar of the internationalized sentence syntax in step 530. A token structure is generated at step 540. The token structure includes a language token to assist translation of the internationalized sentence syntax into a language-specific syntax, as indicated by the language token. The token structure is customizable via the developer interface to configure translation options.

Based on the developer's inputs, the developer interface associates a social graph attribute with a first token of the token structure in step 550. Once the internationalized sentence syntax is configured, the sentence option and the token structure along with the internationalized structure is stored on the social networking system to facilitate run-time translation of sentences in at least the preferred language in step 560.

While the method 500 of FIG. 5 is described in the context of a single networking system, the present disclosure contemplates a plurality of networking systems and/or servers. The plurality of networking systems and/or servers can be located at a single location or a variety of locations.

Figure 6:
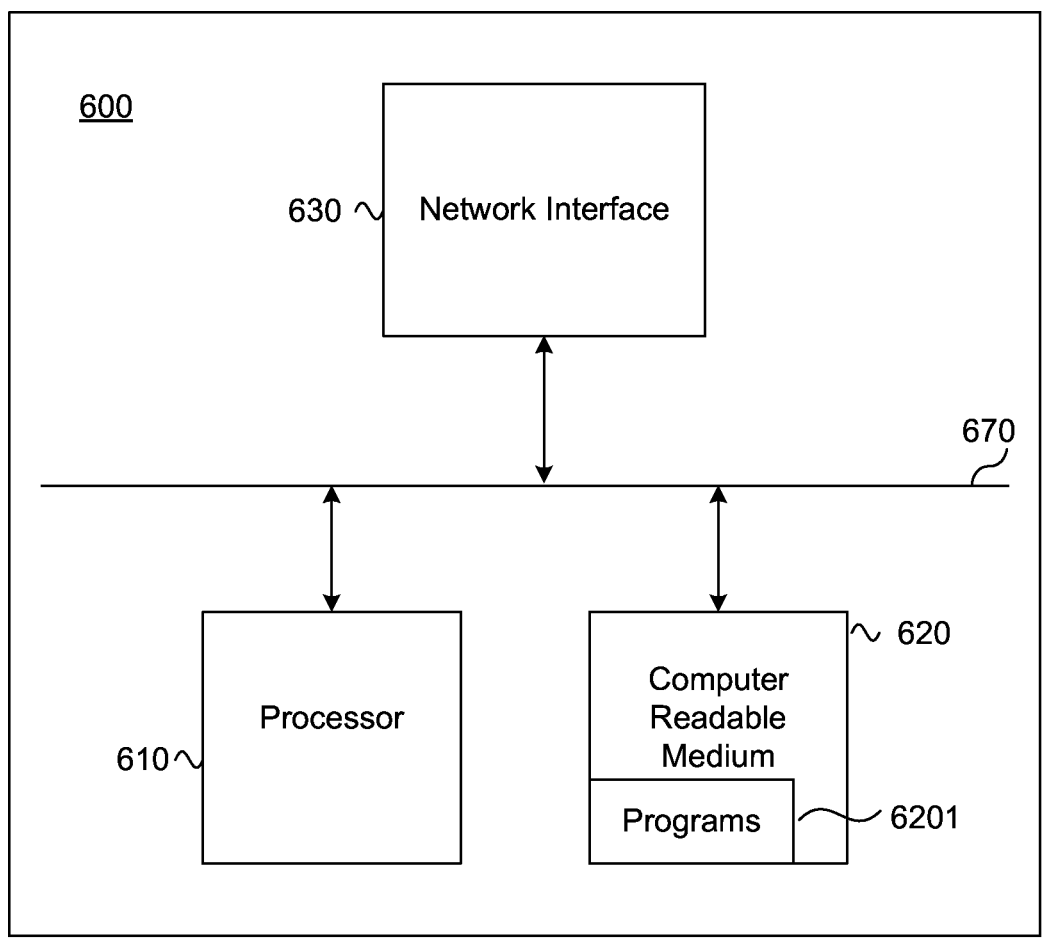
FIG. 6 illustrates an example of a computer system with which some embodiments of the present disclosure may be utilized.

FIG. 6 illustrates a diagram of a computer system 600, in accordance with yet another embodiment of the present disclosure. The computer system 600 may include at least one processor 610, one or more network interface 630 and one or more computer readable medium 620, all interconnected via one or more bus 670. In FIG. 6, various components are omitted for illustrative simplicity. The computer system 600 is intended to illustrate a device on which any other components described in this specification (i.e., any of the components depicted in FIGS. 1-5) can be implemented.

The computer system 600 may take a variety of physical forms. By way of examples, the computer system 600 may be a desktop computer, a laptop computer, a personal digital assistant (PDA), a portable computer, a tablet PC, a wearable computer, an interactive kiosk, a mobile phone, a server, a mainframe computer, a mesh-connected computer, a single-board computer (SBC) (i.e., a BeagleBoard, a PC-on-a-stick, a Cubieboard, a CuBox, a Gooseberry, a Hawkboard, a Mbed, a OmapZoom, a Origenboard, a Pandaboard, a Pandora, a Rascal, a Raspberry Pi, a SheevaPlug, a Trim-Slice, etc.), an embedded computer system, or a combination of two or more of these. Where appropriate, the computer system 600 may include one or more computer systems 600, be unitary or distributed, span multiple locations, span multiple machines, or reside in a cloud, which may include one or more cloud components in one or more networks. Where appropriate, one or more computer systems 600 may perform without substantial spatial or temporal limitation one or more steps of one or more methods described or illustrated herein. As an example and not by way of limitation, one or more computer systems 600 may perform in real time or in batch mode one or more steps of one or more methods described or illustrated herein. One or more computer systems 600 may perform at different times or at different locations one or more steps of one or more methods described or illustrated herein, where appropriate.

The computer system 600 preferably may include an operating system such as, but not limited to, Windows®, Linux® or Unix®. The operating system may include a file management system, which organizes and keeps track of files. In some embodiments, a separate file management system may be provided. The separate file management can interact smoothly with the operating system and provide enhanced and/or more features, such as improved backup procedures and/or stricter file protection.

The at least one processor 610 may be any suitable processor. The type of the at least one processor 610 may comprise one or more from a group comprising a central processing unit (CPU), a microprocessor, a graphics processing unit (GPU), a physics processing unit (PPU), a digital signal processor, a network processor, a front end processor, a data processor, a word processor and an audio processor.

The one or more bus 670 is configured to couple components of the computer system 600 to each other. As an example and not by way of limitation, the one or more bus 670 may include a graphics bus (i.e., an Accelerated Graphics Port (AGP)), an Enhanced Industry Standard Architecture (EISA) bus, a front-side bus (FSB), a HyperTransport (HT) interconnect, an Industry Standard Architecture (ISA) bus, an Infiniband interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or another suitable bus or a combination of two or more of these. Although the present disclosure describes and illustrates a particular bus, this disclosure contemplates any suitable bus or interconnects.

The one or more network interface 630 may include one or more of a modem or network interface. It will be appreciated that a modem or network interface can be considered to be part of the computer system 600. The interface can include an analog modem, an asymmetric digital subscribe line (ADSL) modem, a cable modem, a doubleway satellite modem, a power line modem, a token ring interface, a Cambridge ring interface, a satellite transmission interface or any suitable interface for coupling a computer system to other computer systems. The interface can include one or more input and/or output devices. The I/O devices can include, by way of example but not limitation, a keyboard, a mouse or other pointing device, disk drives, printers, a scanner, a touch screen, a Tablet screen, and other input and/or output devices, including a display device. The display device can include, by way of example but not limitation, a cathode ray tube (CRT) display, a liquid crystal display (LCD), a 3-D display, or some other applicable known or convenient display device. For simplicity, it is assumed that controllers of any devices not depicted in the example of FIG. 6 reside in the interface.

The computer readable medium 620 may include any medium device that is accessible by the processor 610. As an example and not by way of limitation, the computer readable medium 620 may include volatile memory (i.e., a random access memory (RAM), a dynamic RAM (DRAM), and/or a static RAM (SRAM)) and non-volatile memory (i.e., a flash memory, a read-only memory (ROM), a programmable ROM (PROM), an erasable programmable ROM (EPROM), and/or an electrically erasable programmable ROM (EEPROM)). When appropriate, the volatile memory and/or non-volatile memory may be single-ported or multiple-ported memory. This disclosure contemplates any suitable memory. In some embodiments, the computer readable medium 620 may include a semiconductor-based or other integrated circuit (IC) (La, a field-programmable gate array (FPGA) or an application-specific IC (ASIC)), a hard disk, an HOD, a hybrid hard drive (HHD), an optical disc (La, a CD-ROM, or a digital versatile disk (DVD)), an optical disc drive (ODD), a magneto-optical disc, a magneto-optical drive, a floppy disk, a floppy disk drive (FDD), a magnetic tape, a holographic storage medium, a solid-state drive (SSD), a secure digital (SD) card, a SD drive, or another suitable computer-readable storage medium or a combination of two or more of these, where appropriate. The computer readable medium 620 may be volatile, non-volatile, or a combination of volatile and non-volatile, where appropriate.

Programs 6201 may be stored on the one or more computer readable media 620. As an example, but not by way of limitation, the computer system 600 may load the programs 6201 to an appropriate location on the one or more compute readable media 620 for execution. The programs 6201, when executed, may cause the computer system 600 to perform one or more operations or one or more methods described or illustrated herein. In some implementations, the operations may include, but are not limited to, the operations 500 of FIG. 5.

As will be appreciated by one of ordinary skill in the art, the operations or methods may be instantiated locally (i.e., on one local computer system) and may be distributed across remote computer systems. For example, it may be determined that the available computing power of the local computer system is insufficient or that additional computing power is needed, and may offload certain aspects of the operations to the cloud.

While the computer-readable medium is shown in an embodiment to be a single medium, the term "computer-readable medium" should be taken to include single medium or multiple media (e.g., a centralized or distributed database, and/or associated caches and servers) that stores the one or more sets of instructions. The term "computer-readable medium" shall also be taken to include any medium that is capable of storing, encoding or carrying a set of instructions for execution by the computer and that cause the computer to perform any one or more of the methodologies of the presently disclosed technique and innovation.

Further examples of computer-readable medium, machine-readable storage medium, machine-readable medium or computer-readable (storage) medium include but are not limited to recordable type medium such as volatile and non-volatile memory devices, floppy and other removable disks, hard disk drives, optical disks, Digital Versatile Disks, among others and transmission type medium such as digital and analog communication links.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice versa. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A storage medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

The computer may be, but is not limited to, a server computer, a client computer, a personal computer (PC), a tablet PC, a laptop computer, a set-top box (STB), a personal digital assistant (PDA), a cellular telephone, an iPhone®, an iPad®, a processor, a telephone, a web appliance, a network router, switch or bridge, or any machine capable of executing a set of instructions (sequential or otherwise) that specify edges to be taken by that machine.

In alternative embodiments, the machine operates as a standalone device or may be connected (e.g., networked) to other machines. In a networked deployment, the machine may operate in the capacity of a server or a client machine in a client-server network environment, or as a peer machine in a peer-to-peer (or distributed) network environment.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In general, the routines executed to implement the embodiments of the disclosure may be implemented as part of an operating system or a specific application, component, program, object, module or sequence of instructions referred to as "programs." The programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, various embodiments are capable of being distributed as a program product in a variety of forms, and that the disclosure applies equally regardless of the particular type of computer-readable medium used to actually effect the distribution.

Unless the context clearly requires otherwise, throughout the description and the claims, the words "comprise," "comprising," and the like are to be construed in an inclusive sense, as opposed to an exclusive or exhaustive sense; that is to say, in the sense of "including, but is not limited to." As used herein, the terms "connected," "coupled," or any variant thereof, means any connection or coupling, either direct or indirect, between two or more elements; the coupling of connection between the elements can be physical, logical or a combination thereof. Additionally, the words "herein," "above," "below" and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all the following interpretations of the word, any of the items in the list, all of the items in the list and any combination of the items in the list.

The above detailed description of embodiments of the disclosure is not intended to be exhaustive or to limit the teachings to the precise form disclosed above. While specific embodiments of and examples for the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks in a different order, and some processes or blocks may be deleted, moved, added, subdivided, combined and/or modified to provide alternative or sub combinations. Each of these processes or blocks may be implemented in a variety of different ways. Also, while processes or blocks are at times shown as being performed in series, these processes or blocks may instead be performed in parallel or may be performed at different times. Further, any specific numbers noted herein are only examples—alternative implementations may employ differing values or ranges.

Reference in this specification to "one embodiment" or "an embodiment" means that a particular feature, structure or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed herein, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any term discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given herein. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

The teaching of the disclosure provided herein can be applied to other systems and not necessarily to the system described above. Any patents and applications and other references noted above, including any that may be listed in accompanying filing papers, are incorporated herein by reference. Aspects of the disclosure can be modified if necessary to employ the systems, functions and concepts of the various references described above to provide yet further embodiments of the disclosure.

Any patents and applications and other references noted above, including any that may be listed in accompanying filing papers, are incorporated herein by reference. Aspects of the disclosure can be modified if necessary to employ the systems, functions, and concepts of the various references described above to provide yet further embodiments of the disclosure.

These and other changes can be made to the disclosure in light of the above Detailed Description. While the above description describes certain embodiments of the disclosure and describes the best mode contemplated, no matter how detailed the above appears in text, the teachings can be practiced in many ways. Details of the system may vary considerably in its implementation details while still being encompassed by the subject matter disclosed herein. As noted above, particular terminology used when describing certain features or aspects of the disclosure should not be taken to imply that the terminology is being redefined herein to be restricted to any specific characteristics, features or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. §112, ¶6, other aspects may likewise be embodied as a means-plus-function claim, or in other forms, such as being embodied in a computer-readable medium. (Any claims intended to be treated under 35 U.S.C. §112, ¶6 will begin with the words "means for".) Accordingly, the applicant reserves the right to add additional claims after filing the application to pursue such additional claim forms for other aspects of the disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally or logically, are understood to be implemented by computer programs or equivalent electrical circuits, microcode or the like. Furthermore, it has also proven convenient at times to refer to these arrangements of operations as modules, without loss of generality. The described operations and their associated modules may be embodied in software, firmware, hardware or any combinations thereof.

Any of the steps, operations or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer-readable storage medium, or any type of medium suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer-readable storage medium and may include any embodiment of a computer program product or other data combination described herein.

What is claimed is:

1. A method, comprising:
   providing a developer interface for a developer account to define an internationalized sentence syntax to associate with an application on a social networking system that has multiple applications, the internationalized sentence syntax for rendering a natural language expression based on at least a social graph edge in a social graph of the social networking system on behalf of the application, wherein the social graph includes two or more social network nodes interconnected by one or more social graph edges;
   generating a token structure to define the internationalized sentence syntax, wherein the token structure includes a customizable language token to designate the internationalized sentence syntax as a language-specific syntax to translate into a preferred language indicated by the customizable language token, the token structure customizable via the developer interface to configure translation options of the internationalized sentence syntax;
   providing, via the social networking system, a sentence option on the developer interface for selection to define grammar of the internationalized sentence syntax, wherein defining the grammar includes inserting one or more tokens representing an actor, a target, an edge, or any combination thereof, into the token structure of the internationalized sentence syntax;
   associating a social graph attribute with a first token of the token structure;
   storing the sentence option and the token structure with the internationalized sentence syntax to facilitate run-time translation by the application of a natural language expression in a primary language into the natural language expression in the preferred language; and
   performing, by a computer system of the social networking system, application-specific run-time translation of a user activity from the primary language to the preferred language by configuring the application to express the user activity through the application according to the internationalized sentence syntax, wherein said performing the application-specific run-time translation includes fitting grammatical elements of the user activity according to the token structure associated with the application, further wherein the fitting is based on attributes indicated by the social graph.

2. The method of claim 1, wherein associating the social graph attribute includes associating a gender of an actor of the internationalized sentence syntax with the first token.

3. The method of claim 1, wherein associating the social graph attribute includes associating a target attribute with the first token, the target attribute being whether a target object of the internationalized sentence syntax is possessive or nominative.

4. The method of claim 1, wherein associating the social graph attribute includes associating a numeric attribute with the first token, the numeric attribute being whether a target or an actor of the internationalized sentence syntax is singular or plural.

5. The method of claim 1, wherein the token structure is customized including an arrangement of tokens in the developer interface to generate the run-time translation based on the social graph attribute of the first token.

6. The method of claim 1, wherein associating the social graph attribute includes associating a viewer attribute with the first token, the viewer attribute being a gender attribute or a seniority attribute of a potential viewer user of the natural language expression.

7. The method of claim 1, further comprising presenting language options for the customizable language token on the developer interface, the language options presented in a hierarchy of relevance to the developer account's present and prior language preferences.

8. The method of claim 1, further comprising:
generating a raw sentence from the internationalized sentence syntax;
exporting the raw sentence to a third party for translations from the primary language to the one or more languages; and
importing the translations from the third party.

9. The method of claim 8, wherein the translations imported from the third party include translations to the variations of the internationalized sentence syntax.

10. A processor-based system, comprising:
a non-transitory storage medium; and
an internationalization platform module stored on the non-transitory storage medium executable by a processor, wherein the internationalization platform module provides computer-generated output;
wherein the internationalization platform module, when executed by the processor, is configured to:
provide a developer interface for a developer account to define an internationalized sentence syntax to associate with an application on a social networking system that has multiple applications, the internationalized sentence syntax for rendering a natural language expression of at least a social graph edge in a social graph of the social networking system on behalf of the application, wherein the social graph includes two or more social graph nodes, representing social network objects, interconnected by one or more social graph edges;
generate a token structure to define the internationalized sentence syntax, wherein the token structure includes a customizable language token to designate the internationalized sentence syntax as a language-specific syntax to translate into a preferred language indicated by the customizable language token, the token structure customizable via the developer interface to configure translation options of the internationalized sentence syntax;
providing, via the social networking system, a sentence option on the developer interface for selection to define grammar of the internationalized sentence syntax, wherein defining the grammar includes inserting one or more tokens representing an actor, an edge, a target, or any combination thereof, into the token structure of the internationalized sentence syntax;
associate a social graph attribute with a first token of the token structure;
store the sentence option and the token structure with the internationalized sentence syntax to facilitate run-time translation of the internationalized sentence syntax into the natural language expression in the preferred language; and
perform, by a computer system of the social networking system, application-specific run-time translation of a user activity from a first language to a second language by configuring the application to express the user activity through the application according to the internationalized sentence syntax, wherein said performing the application-specific run-time translation includes fitting grammatical elements of the user activity according to the token structure associated with the application, further wherein the fitting is based on attributes indicated by the social graph.

11. The processor-based system as recited in claim 10, wherein the internationalization platform module is configured to generate a gender token to define the gender of the internationalized sentence syntax's actor.

12. The processor-based system as recited in claim 10, wherein the internationalization platform module is configured to generate a target token to determine whether the internationalized sentence syntax's target is possessive or nominative.

13. The processor-based system as recited in claim 10, wherein the internationalization platform module is configured to generate a number token for each number in the internationalized sentence syntax to select a plural type of the corresponding number.

14. The processor-based system as recited in claim 10, wherein the computer system is configured to generate a viewer token to select the gender or seniority of targeted viewers of the translations.

15. A method performed by a computing device, comprising:
receiving an edge from a social graph to be expressed via a social application coupled to a social networking system having multiple applications, the edge establishing a directional relationship between an actor object and a target object, wherein the social graph includes two or more nodes, representing social network objects of the social networking system, interconnected by one or more edges;
identifying a supported language from a language token associated with an internationalized sentence syntax that is associated with the social application; and
rendering, by the computing device, a natural language expression of the edge in the supported language based on an attribute of the edge, the actor object, or the target object and based on at least a token structure in the internationalized sentence syntax defined for the attribute, wherein the token structure includes an actor token, an edge token, a target token, or any combination thereof, wherein the natural language expression is an application-specific run-time translation of the edge according to the internationalized sentence syntax, wherein said rendering includes fitting elements of the edge to the token structure associated with the application, further wherein the fitting is based on attributes indicated by the social graph; and
publishing, on behalf of the social application, the natural language expression in a forum on the social networking system.

16. The method of claim 15, wherein rendering the natural language expression includes determining a target attribute of whether the target is possessive or nominative and rendering the natural language expression based on the token structure associated with the target attribute.

17. The method of claim 15, wherein rendering the natural language expression includes determining a gender attribute of the actor object or the target object and rendering the natural language expression based on the token structure associated with the gender attribute.

18. The method of claim 15, wherein rendering the natural language expression includes determining a numeric attribute of the actor object or the target object and rendering the natural language expression based on the token structure associated with the numeric attribute.

19. The method of claim 15, wherein rendering the natural language expression is based on a viewer attribute of a user accessing the forum.

20. The method of claim 15, wherein rendering the natural language expression is based on a viewer attribute of a user in control of the forum.

21. The method of claim 1, wherein the grammatical elements includes a sentence actor, a sentence target, a relationship established by the sentence actor or the sentence target, or any combination thereof.

* * * * *